United States Patent
Sun (10) Patent No.: US 11,367,764 B2
(45) Date of Patent: Jun. 21, 2022

(54) OLED DISPLAY PANEL, DEVICE AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Jiajia Sun, Wuhan (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 107 days.

(21) Appl. No.: 16/764,239

(22) PCT Filed: Nov. 19, 2019

(86) PCT No.: PCT/CN2019/119343
§ 371 (c)(1),
(2) Date: May 14, 2020

(87) PCT Pub. No.: WO2021/077508
PCT Pub. Date: Apr. 29, 2021

(65) Prior Publication Data
US 2021/0408147 A1 Dec. 30, 2021

(30) Foreign Application Priority Data

Oct. 23, 2019 (CN) .......................... 201911012459.2

(51) Int. Cl.
*H01L 27/32* (2006.01)
*H01L 51/00* (2006.01)
(Continued)

(52) U.S. Cl.
CPC ........ *H01L 27/326* (2013.01); *H01L 27/3234* (2013.01); *H01L 51/001* (2013.01);
(Continued)

(58) Field of Classification Search
None
See application file for complete search history.

(56) References Cited

U.S. PATENT DOCUMENTS

| 2019/0051859 A1 | 2/2019 | Choi et al. |
| 2019/0081273 A1 | 3/2019 | Sung et al. |

(Continued)

FOREIGN PATENT DOCUMENTS

| CN | 106887523 A | 6/2017 |
| CN | 107452894 A | 12/2017 |

(Continued)

*Primary Examiner* — J. E. Schoenholtz
(74) *Attorney, Agent, or Firm* — Benesch, Friedlander, Coplan & Aronoff LLP (57) ABSTRACT

An organic light-emitting diode (OLED) display panel, device, and a manufacturing method thereof are provided. The OLED display panel includes a base plate, a driving circuit layer, a light-emitting functional layer, an encapsulation layer, and a blocking member. The blocking member is disposed in the non-display area and is located between a second organic flexible layer and the encapsulation layer. The light-emitting functional layer is disconnected by the blocking member. The external moisture cannot enter the display area along the light-emitting functional layer by disconnecting the light-emitting functional layer through the barrier member.

18 Claims, 7 Drawing Sheets

(51) Int. Cl.
*H01L 51/52* (2006.01)
*H01L 51/56* (2006.01)

(52) U.S. Cl.
CPC ...... *H01L 51/0097* (2013.01); *H01L 51/5253* (2013.01); *H01L 51/56* (2013.01); *H01L 2227/323* (2013.01); *H01L 2251/5338* (2013.01)

(56) References Cited

U.S. PATENT DOCUMENTS

| | | |
|---|---|---|
| 2019/0288047 A1 | 9/2019 | Jeong et al. |
| 2019/0355799 A1* | 11/2019 | Jeong ................. H01L 27/3262 |
| 2020/0035950 A1 | 1/2020 | Seo et al. |
| 2020/0106047 A1 | 4/2020 | Choi et al. |
| 2020/0161582 A1* | 5/2020 | Choi .................... H01L 27/326 |
| 2020/0203660 A1 | 6/2020 | Shi |
| 2020/0212353 A1 | 7/2020 | Kim et al. |

FOREIGN PATENT DOCUMENTS

| | | |
|---|---|---|
| CN | 108649141 A | 10/2018 |
| CN | 109390494 A | 2/2019 |
| CN | 109509769 A | 3/2019 |
| CN | 109671864 A | 4/2019 |
| CN | 109801941 A | 5/2019 |
| CN | 110010665 A | 7/2019 |
| CN | 110112101 A | 8/2019 |
| CN | 110120464 A | 8/2019 |
| CN | 110137370 A | 8/2019 |
| CN | 110190104 A | 8/2019 |
| CN | 110277512 A | 9/2019 |

\* cited by examiner

OLED DISPLAY PANEL, DEVICE AND MANUFACTURING METHOD THEREOF

FIELD OF INVENTION

This application claims the priority of the Chinese patent application No. 201911012459.2, filed on Oct. 23, 2019, the title is OLED display panel and manufacturing method thereof. The disclosure of the aforementioned application is hereby incorporated by reference in its entirety.

The present invention relates to fields of organic light-emitting diode (OLED) display technology, and in particular, to OLED display panels, devices, and manufacturing methods thereof.

BACKGROUND OF INVENTION

The existing full-screen technology requires digging a hole, which causes moisture to invade a light-emitting functional layer of a display area through a side wall of the hole, thereby causing the OLED display panel failure.

Therefore, the existing OLED display panel has a technical problem that the moisture invades an interior of the panel along the light-emitting functional layer after the hole is dug.

SUMMARY OF INVENTION

The application provides an organic light-emitting diode (OLED) display panel and a manufacturing method thereof, which are used to solve the technical problem that the moisture invades an interior of a panel along a light-emitting functional layer after an OLED display panel is dug.

To solve the above problems, the technical solutions provided in the present application are as follows:

An embodiment of the present application provides an organic light-emitting diode (OLED) display panel. The OLED display panel includes a display area, a through hole area configured to correspond to an electronic component, and a non-display area provided between the display area and the through hole area, the OLED display panel includes:

a base plate includes a first organic flexible layer, a moisture barrier layer, and a second organic flexible layer sequentially disposed stacked on the substrate;

a driving circuit layer provided on the second organic flexible layer;

a light-emitting functional layer provided on the driving circuit layer;

an encapsulation layer; and a blocking member provided in the non-display area and located between the second organic flexible layer and the encapsulation layer, wherein the light-emitting functional layer is disconnected by the blocking member.

In the OLED display panel provided in the present application, in the non-display area, the display panel includes a concave hole structure, and the blocking member provided in the concave hole structure.

In the OLED display panel provided in the present application, the concave hole structure includes a first through hole penetrating through the second flexible layer and a second through hole penetrating through the light-emitting functional layer and the driving circuit layer, and the blocking member filled in the first through hole and the second through hole.

In the OLED display panel provided in the present application, the light-emitting functional layer includes an organic light-emitting layer, the organic light-emitting layer including a first region of the light-emitting functional layer provided on a bottom of the first through hole, a second region of the light-emitting functional layer provided on a side wall of the driving circuit layer and on a side wall of the second through hole located in the second through hole, wherein the blocking member provided on the light-emitting functional layer located in the first through hole.

In the OLED display panel provided in the present application, a cross-sectional shape of the first through hole is a trapezoidal shape, and a cross-sectional shape of the second through hole is a rectangular shape.

In the OLED display panel provided in the present application, an included angle formed by the two lateral sides of a cross-section of the first through hole of the concave hole structure and corresponding lateral sides of a cross-section of the second through hole of the concave hole structure is greater than 180 degrees.

In the OLED display panel provided in the present application, a hydrophobic material is filled in the concave hole structure, and the hydrophobic material is the same as material of the light-emitting functional layer.

In the OLED display panel provided in the present application, the blocking member is a protrusion structure, and in the non-display area, the light-emitting functional layer is disconnected by the protrusion structure at the first through hole.

An embodiment of the present application provides an organic light-emitting diode (OLED) display device, the OLED display device includes an OLED display panel. the OLED display device includes a display area, a through hole area configured to correspond an electronic component, and a non-display area provided between the display area and the through hole area, the OLED display device includes:

a base plate includes a first flexible layer, a moisture barrier layer and a second flexible layer sequentially stacked;

a driving circuit layer provided on the second flexible layer;

a light-emitting functional layer provided on the driving circuit layer;

an encapsulation layer; and a blocking member provided in the non-display area and located between the second flexible layer and the encapsulation layer, wherein the light-emitting functional layer is disconnected by the blocking member.

In the OLED display device provided in the present application, in the non-display area, the display device includes a concave hole structure, and the blocking member provided in the concave hole structure.

In the OLED display device provided in the present application, the concave hole structure includes a first through hole penetrating through the second flexible layer, a second through hole penetrating through the light-emitting functional layer and the driving circuit layer, and the blocking member filled in the first through hole and the second through hole.

In the OLED display device provided in the present application, the light-emitting functional layer includes an organic light-emitting layer, the organic light-emitting layer including a first region of the light-emitting functional layer provided on a bottom of the first through hole, a second region of the light-emitting functional layer provided on a side wall of the driving circuit layer and on a side wall of the second through hole located in the second through hole, wherein the blocking member provided on the light-emitting functional layer located in the first through hole.

In the OLED display device provided in the present application, a cross-sectional shape of the first through hole is a trapezoidal shape, and a cross-sectional shape of the second through hole is a rectangular shape.

In the OLED display device provided in the present application, an included angle formed by the two lateral sides of a cross-section of the first through hole of the concave hole structure and corresponding lateral sides of a cross-section of the second through hole of the concave hole structure is greater than 180 degrees.

In the OLED display device provided in the present application, a hydrophobic material is filled in the concave hole structure, and the hydrophobic material is the same as material of the light-emitting functional layer.

In the OLED display device provided in the present application, the blocking member is a protrusion structure, and in the non-display area, the light-emitting functional layer is disconnected by the protrusion structure at the first through hole.

In the OLED display device provided in the present application, two lateral sides of a cross-section of the protrusion structure are both curved.

In the OLED display device provided in the present application, in the first through hole, a lateral side of a cross-section of the protrusion structure near a side of the display area is a curve, and a lateral side of the cross-section of the protrusion structure near a side of the through hole area is a straight line.

A manufacturing method of an organic light-emitting diode (OLED) display panel, including steps of:

providing a substrate;

sequentially forming a first organic flexible layer, a moisture barrier layer, and a second organic flexible layer stacked on the substrate;

forming a blocking member in a non-display area, and forming a driving circuit layer on the second organic flexible layer, wherein the driving circuit layer is disconnected at the blocking member;

evaporating a light-emitting functional layer on the driving circuit layer, wherein the light-emitting functional layer is disconnected at the blocking member; and depositing an encapsulation layer on the light-emitting functional layer.

In the manufacturing method of the OLED display panel provided in the present application, the manufacturing method further includes a step of: forming a blocking wall on a concave hole structure by exposure and etching or shielding by a mask, wherein material of the blocking wall is the same as the blocking member.

The beneficial effects of the present application are as follows: the present application provides an OLED display panel, a device, and a manufacturing method thereof. The OLED display panel includes a display area, a through hole area provided corresponding to an electronic component, and a non-display area provided between the display area and the through hole area. The OLED display panel includes a base plate, a driving circuit layer, a light-emitting functional layer, an encapsulation layer, and a blocking member. The flexible substrate includes a first organic flexible layer, a moisture barrier layer, and a second organic flexible layer which are sequentially stacked on the substrate. The blocking member is provided in the non-display area and is located between the second organic flexible layer and the encapsulation layer, and the light-emitting functional layer is disconnected by the blocking member. By providing the blocking member in the non-display area and by disconnecting the light-emitting functional layer through the blocking member, the external moisture cannot enter the display area along the light-emitting functional layer through a side wall of the hole, which relieves the technical problem that the moisture invades the panel along the light-emitting functional layer after the hole is dug in the prior art.

DRAWINGS

In order to more clearly explain the embodiments or the technical solutions compared with the prior art, the drawings used in the description of the embodiments or the prior art will be briefly introduced below. It is apparent that the drawings in the following description are only some embodiments of the application. For those skilled in the art, other drawings can be obtained according to these drawings without paying any creative work.

DETAILED DESCRIPTION OF EMBODIMENTS

The following embodiments are illustrated with reference to the accompanying drawings to illustrate specific embodiments that can be implemented by the present application. The directional terms mentioned in the present application, such as up, down, front, rear, left, right, in, out, lateral side, etc., are only refer to the direction of the accompanying drawings. Therefore, the directional terms used are illustrated to explain and understand the present application, and not to limit the scope of the present application. In the figures, similarly structured units are denoted by the same reference numerals.

In view of the existing organic light-emitting diode (OLED) display panel technical problem that the moisture invades the panel along the light-emitting functional layer after the hole is dug, the embodiments of the present application can solve this problem.

Figure 1:
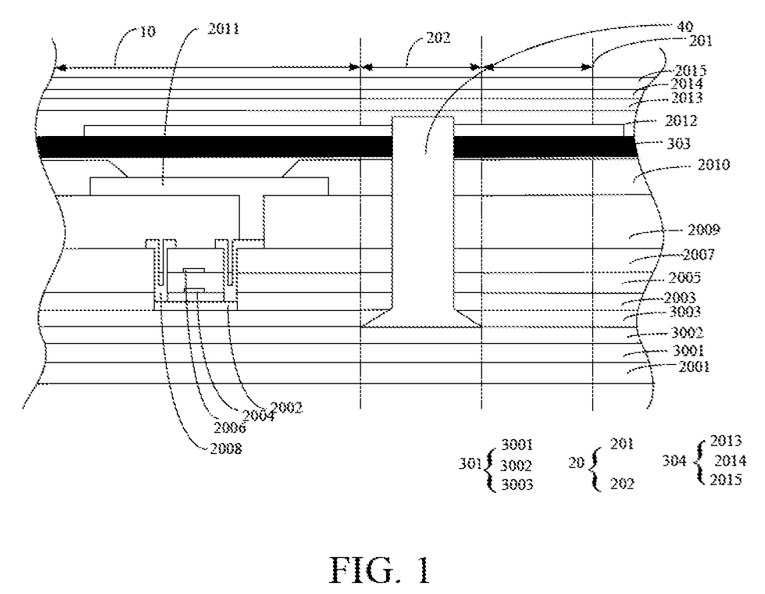
FIG. 1 is a first schematic cross-sectional view of an organic light-emitting diode (OLED) display panel according to an embodiment of the present application.

As shown in FIG. 1, an organic light-emitting diode (OLED) display panel includes a substrate 2001, a first organic flexible layer 3001, a moisture barrier layer 3002, a second organic flexible layer 3003, an active layer 2002, a gate insulating layer 2003, a first gate electrode layer 2004, a first insulating layer 2005, a second gate electrode layer 2006, an interlayer insulating layer 2007, a source/drain layer 2008, a planarization layer 2009, a pixel defining layer 2010, a pixel electrode layer 2011, a light-emitting functional layer 303, and a common electrode Layer 2012, a first inorganic barrier layer 2013, an organic polymer layer 2014, and a second inorganic barrier layer 2015. An electronic component 50 is provided below the display panel in the electronic component setting area 20. The electronic component setting area 20 includes a through hole area 201 and a non-display area 202.

Figure 2:
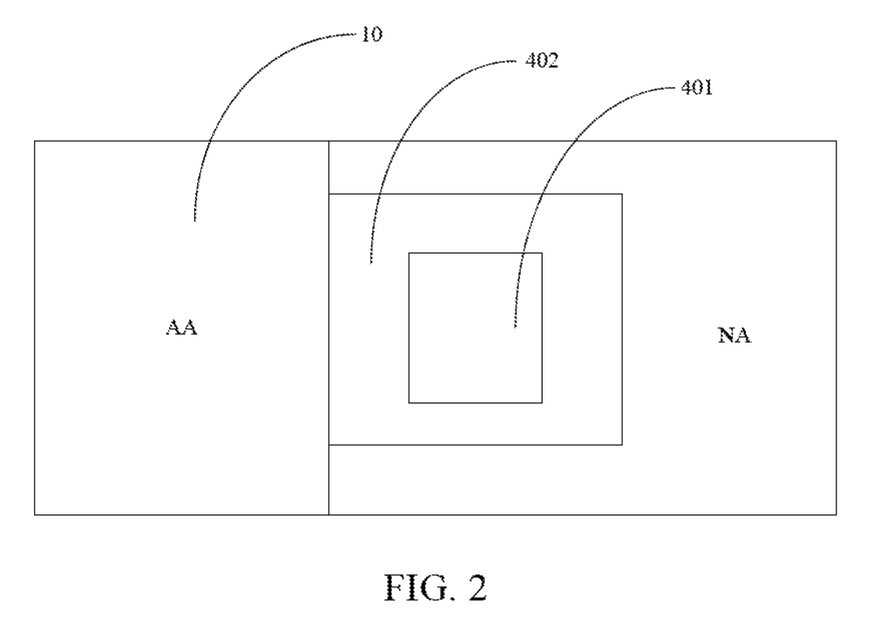
FIG. 2 is a schematic plan view of an OLED display panel according to an embodiment of the present application.

As shown in FIGS. 1 and 2, an OLED display panel provided in the present application includes a display area, a through hole area 201 provided corresponding to the electronic component 50, and a non-display area 202 provided between the display area and the through hole area. The OLED display panel includes a flexible substrate 301, a driving circuit layer 302, a light-emitting functional layer 303, an encapsulation layer 304, and a blocking member 40. The blocking member 40 is provided in the non-display area 202, and the light-emitting functional layer 303 is disconnected by the blocking member 40.

In this embodiment, the OLED display panel includes the display area, the through hole area 201 provided corresponding to the electronic component 50, and the non-display area 202 provided between the display area and the through hole area. The OLED display panel includes the flexible substrate, the driving circuit layer, the light-emitting functional layer, the encapsulation layer, and the blocking member. The blocking member is provided in the non-display area, and the light-emitting functional layer is disconnected by the blocking member. By providing the blocking member in the non-display area, and by disconnecting the light-emitting functional layer through the blocking member, the external moisture cannot enter the display area along the light-emitting functional layer through a sidewall of the hole, which relieves the technical problem that the moisture invades the panel along the light-emitting functional layer after the hole dug in the prior art.

In one embodiment, in the non-display area 10, the display panel includes a concave hole structure 401, and the blocking member 40 is provided in the concave hole structure 401.

In one embodiment, the concave hole structure 401 includes a first through hole penetrating through the second flexible layer, and a second through hole penetrating through the light-emitting functional layer 303 and the driving circuit layer 302, and the blocking member 40 is filled within the first through hole and the second through hole.

In one embodiment, the light-emitting functional layer 303 includes an organic light-emitting layer, and the organic light-emitting layer includes a first region of the light-emitting functional layer 303 provided on the bottom of the first through hole, a second region of the light-emitting functional layer 303 provided on a side wall of the driving circuit layer 302 and on a side wall of the second through hole located in the second through hole, and the blocking member 40 provided on the light-emitting functional layer located in the first through hole.

In one embodiment, a cross-sectional shape of the first through hole is a trapezoidal shape, and a cross-sectional shape of the second through hole is a rectangular shape.

In one embodiment, the blocking member 40 is a concave hole structure 401. The concave hole structure 401 includes a first through hole located in the second organic flexible layer 3003 and a second through hole located on the second organic flexible layer 3003. The light-emitting functional layer 303 located in the first through hole is disconnected by the recessed hole structure 401.

In one embodiment, the blocking member 40 is a concave hole structure 401. The concave hole structure 401 includes a first through hole located in the second organic flexible layer 3003 and a second through hole located on the second organic flexible layer 3003. The second through hole penetrates through the encapsulation layer, the light-emitting functional layer 303, and the driving circuit layer 302. The light-emitting functional layer 303 located in the first through hole is disconnected by the concave hole structure 401.

In one embodiment, an included angle formed by two lateral sides of a cross-section of the first through hole of the concave hole structure 401 and corresponding lateral sides of a cross-section of the second through hole is greater than 180 degrees.

In one embodiment, in the first through hole, a cross-sectional shape of the concave hole structure 401 is a trapezoidal shape.

In one embodiment, in the first through hole, two lateral sides of a cross-section of the concave hole structure 401 are both curved.

In one embodiment, a hydrophobic material is filled in the concave hole structure 401, and the hydrophobic material is the same as material of the light-emitting functional layer 303.

In one embodiment, the blocking member 40 has a protrusion structure, and the protrusion structure penetrates through the encapsulation layer, the light-emitting functional layer 303, the driving circuit layer 302, and the second organic flexible layer 3003. A thickness of the protrusion structure is larger than twice of a film thickness of the light-emitting functional layer 303, and the light-emitting functional layer 303 in the non-display area 10 is disconnected by the protrusion structure.

In one embodiment, in the second organic flexible layer 3003, a cross-sectional shape of the protrusion structure is a trapezoidal shape.

In one embodiment, the blocking member 40 is a concave hole structure 401. The concave hole structure 401 includes a first through hole located in the second organic flexible layer 3003, and a second through hole located on the second organic flexible layer 3003. The light-emitting functional layer 303 located in the first through hole is disconnected by the concave hole structure 401.

In one embodiment, an included angle formed by the two lateral sides of a cross-section of the first through hole of the concave hole structure 401 and corresponding lateral sides of a cross-section of the second through hole of the concave hole structure 401 is greater than 180 degrees. When the light-emitting functional layer 303 is formed, the light-emitting material molecules are deposited on an entire surface, the light-emitting material molecules cannot be attached to a lateral side of the first through hole, and the formed light-emitting functional layer 303 is disconnected in the first through hole.

In one embodiment, in the first through hole, the cross-sectional shape of the concave hole structure 401 is a trapezoidal shape. The configuration of the trapezoidal shape can effectively cut off the light-emitting functional layer 303 and is easy to operate.

In one embodiment, in the first through hole, two lateral sides of the cross-section of the concave hole structure 401 are both curved.

In one embodiment, a hydrophobic material is filled in the concave hole structure 401, and the hydrophobic material is the same as material of the light-emitting functional layer 303.

In one embodiment, the blocking member 40 is a protrusion structure 402, and a thickness of the protrusion structure 402 is larger than twice of a film thickness of the light-emitting functional layer 303. The light-emitting functional layer 303 located in the non-display area 202 is disconnected by the protrusion structure 402.

In one embodiment, a cross-sectional shape of the protrusion structure 402 is a trapezoidal shape.

In one embodiment, in the OLED display panel, in the first through hole, the two lateral sides of the cross-section of the blocking member 40 are both curved, which are aesthetic. When the display panel is bent, the contacted film layers are embedded with each other, and therefore attach firmly.

In one embodiment, in the OLED display panel, in the first through hole, a lateral side of a cross-section of the blocking member 40 near a side of the display area 10 is a curve, and a lateral side of the cross-section of the blocking member 40 near a side of the through hole area 201 is a straight line.

In one embodiment, in the OLED display panel, in the first through hole, a lateral side of a cross-section of the blocking member 40 near a side of the display area 10 is a straight line, and a lateral side of the cross-section of the blocking member 40 near a side of the through hole area 201 is a curve.

In one embodiment, in the OLED display panel, a hydrophobic material is filled in the blocking member 40.

In one embodiment, in the OLED display panel, the hydrophobic material is Teflon.

In one embodiment, in the OLED display panel, the hydrophobic material is the same as material of the moisture barrier layer.

In one embodiment, in the OLED display panel, a blocking wall is provided on the blocking member 40, and the blocking wall is formed by exposing a filling material in the blocking member 40 to prevent the moisture from entering the display area 10.

In one embodiment, in the OLED display panel, material of the blocking wall is the same as the filling material.

Figure 3:
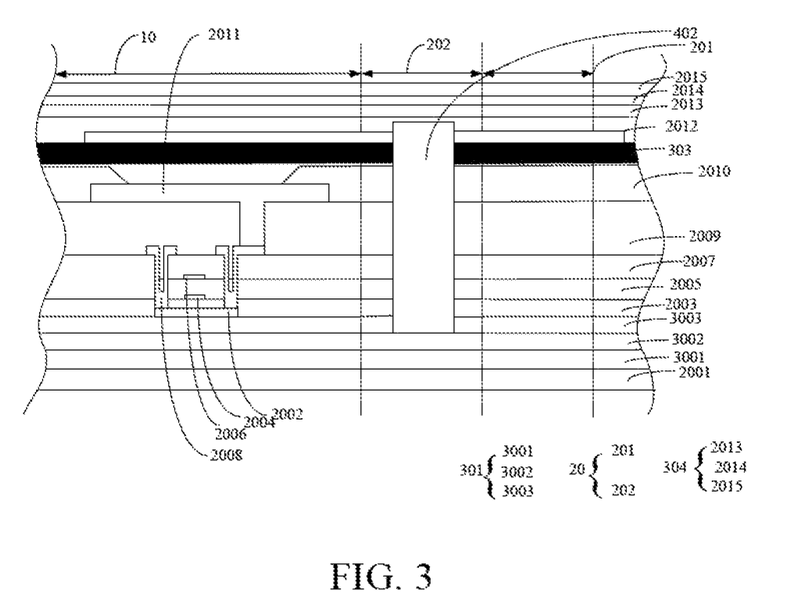
FIG. 3 is a second schematic cross-sectional view of an OLED display panel according to an embodiment of the present application.

In one embodiment, as shown in FIG. 3, in the OLED display panel, the blocking member 40 is a protrusion structure 402, and a thickness of the protrusion structure 402 is larger than twice of a film thickness of the light-emitting functional layer 303. The light-emitting functional layer 303 located in the non-display area 202 is disconnected by the protrusion structure 402.

In one embodiment, in the OLED display panel, a shape of the protrusion structure 402 is a trapezoidal shape.

In an embodiment, in the OLED display panel, in the first through hole, two lateral sides of the cross-section of the protrusion structure 402 are both curved.

In one embodiment, in the OLED display panel, in the first through hole, a lateral side of a cross-section of the protrusion structure 402 near a side of the display area 10 is a curve, and a lateral side of the cross-section of the protrusion structure 402 near a side of the through hole area 201 is a straight line.

In one embodiment, in the OLED display panel, in the first through hole, a lateral side of a cross-section of the protrusion structure 402 near a side of the display area 10 is a straight line, and a lateral side of the cross-section of the protrusion structure 402 near a side of the through hole area 201 is a curve.

In one embodiment, in the OLED display panel, the protrusion structure 402 is a hydrophobic material.

In one embodiment, in the OLED display panel, the hydrophobic material is Teflon.

In one embodiment, in the OLED display panel, the hydrophobic material is the same as material of the moisture barrier layer.

In one embodiment, in the OLED display panel, a planar shape of digging holes in the non-display area 202 includes, but is not limited to, a circle, an oval, and a polygon.

In one embodiment, in the OLED display panel, at least one blocking member 40 is included.

In one embodiment, in the OLED display panel, two blocking members 40 are included, and the blocking members 40 are located in the same digging hole area.

In one embodiment, in the OLED display panel, two blocking members 40 are included, and the blocking members 40 are located in different digging hole areas.

In one embodiment, in the OLED display panel, a first blocking member 40 is located in the non-display area 202, and a second blocking member 40 is located in the through hole area 201.

In one embodiment, in the OLED display panel, the blocking member 40 located in the first through hole does not penetrate through the second flexible organic layer.

Figure 4:
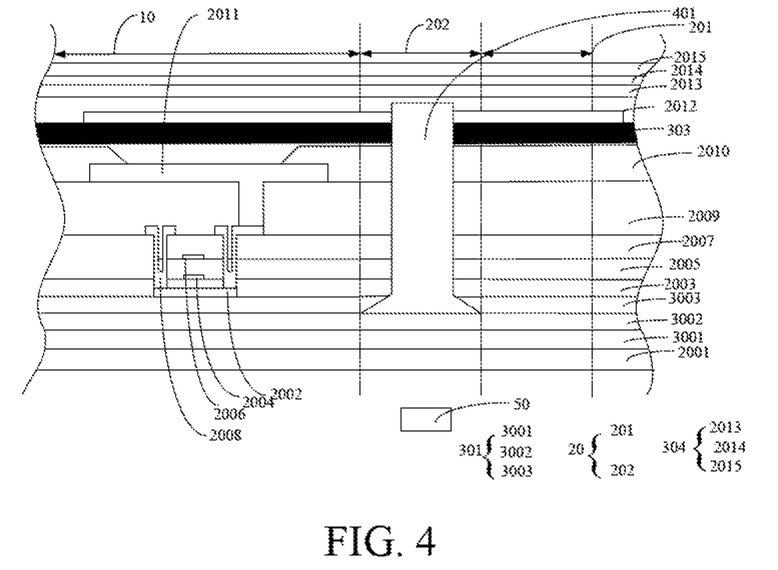
FIG. 4 is a schematic cross-sectional view of an OLED display device according to an embodiment of the present application.

As shown in FIG. 4, an OLED display device provided in the present application includes an OLED display panel, the OLED display panel includes a display area 10, a electronic component setting area 20 provided corresponding to the electronic component 50, the electronic component setting area 20 includes a through hole area 201 and a non-display area 202, and the non-display area 202 surrounds the through hole area 201 and contacts the display area 10. The OLED display panel includes a flexible substrate 301, a driving circuit layer 302, a light-emitting functional layer 303, an encapsulation layer 304, and a blocking member 40. The blocking member 40 is provided in the non-display area 202, and the light-emitting functional layer 303 is disconnected by the blocking member 40.

In this embodiment, the OLED display device includes the OLED display panel, the OLED display panel includes the display area, the electronic component setting area provided corresponding to the electronic component, the electronic component setting area includes the through hole area and the non-display area, and the non-display area surrounds the through hole area and contacts the display area. The OLED display panel includes the flexible substrate, the driving circuit layer, the light-emitting functional layer, the encapsulation layer, and the blocking member. The blocking member is provided in the non-display area, and the light-emitting functional layer is disconnected by the blocking member. By providing the blocking member in the non-display area, and by disconnecting the light-emitting functional layer through the blocking member, the external moisture cannot enter the display area along the light-emitting functional layer through a sideman of the hole, which relieves the technical problem that the moisture invades the panel along the light-emitting functional layer after the hole dug in the prior art.

In one embodiment, in the OLED display device, the blocking member 40 is a concave hole structure 401. The concave hole structure 401 includes a first through hole located in the second organic flexible layer, and a second through hole located on the second organic flexible layer. The light-emitting functional layer 303 located in the first through hole is disconnected by the concave hole structure 401.

In one embodiment, in the OLED display device, an included angle formed by the two lateral sides of a cross-section of the first through hole of the concave hole structure 401 and corresponding lateral sides of a cross-section of the second through hole of the concave hole structure 401 is greater than 180 degrees. When the light-emitting functional layer 303 is formed, the light-emitting material molecules are deposited on an entire surface, the light-emitting material molecules cannot be attached to a lateral side of the first through hole, and the formed light-emitting functional layer 303 is disconnected in the first through hole.

In one embodiment, in the OLED display device, in the first through hole, the cross-sectional shape of the concave hole structure 401 is a trapezoidal shape. The configuration of the trapezoidal shape can effectively cut off the light-emitting functional layer 303 and is easy to operate.

In one embodiment, in the OLED display device, in the first through hole, two lateral sides of the cross-section of the concave hole structure 401 are both curved.

In one embodiment, in the OLED display device, a hydrophobic material is filled in the concave hole structure 401, and the hydrophobic material is the same as material of the light-emitting functional layer 303.

In one embodiment, in the OLED display device, the blocking member 40 is a protrusion structure 402, and a thickness of the protrusion structure 402 is larger than twice of a film thickness of the light-emitting functional layer 303. The light-emitting functional layer 303 located in the non-display area 202 is disconnected by the protrusion structure 402.

In one embodiment, in the OLED display device, a cross-sectional shape of the protrusion structure 402 is a trapezoidal shape.

In one embodiment, in the OLED display device, in the first through hole, the two lateral sides of the cross-section of the blocking member 40 are both curved, which are aesthetic. When the display panel is bent, the contacted film layers are embedded with each other, and therefore they attach firmly.

In one embodiment, in the OLED display device, in the first through hole, a lateral side of a cross-section of the blocking member 40 near a side of the display area 10 is a curve, and a lateral side of the cross-section of the blocking member 40 near a side of the through hole area 201 is a straight line.

In one embodiment, in the OLED display device, in the first through hole, a lateral side of a cross-section of the blocking member 40 near a side of the display area 10 is a straight line, and a lateral side of the cross-section of the blocking member 40 near a side of the through hole area 201 is a curve.

In one embodiment, in the OLED display device, a hydrophobic material is filled in the blocking member 40.

In one embodiment, in the OLED display device, the hydrophobic material is Teflon.

In one embodiment, in the OLED display device, the hydrophobic material is the same as material of the moisture barrier layer.

In one embodiment, in the OLED display device, a blocking wall is provided on the blocking member 40, and the blocking wall is formed by exposing a filling material in the blocking member 40 to prevent the moisture from entering the display area 10.

In one embodiment, in the OLED display device, material of the blocking wall is the same as the filling material.

Figure 5:
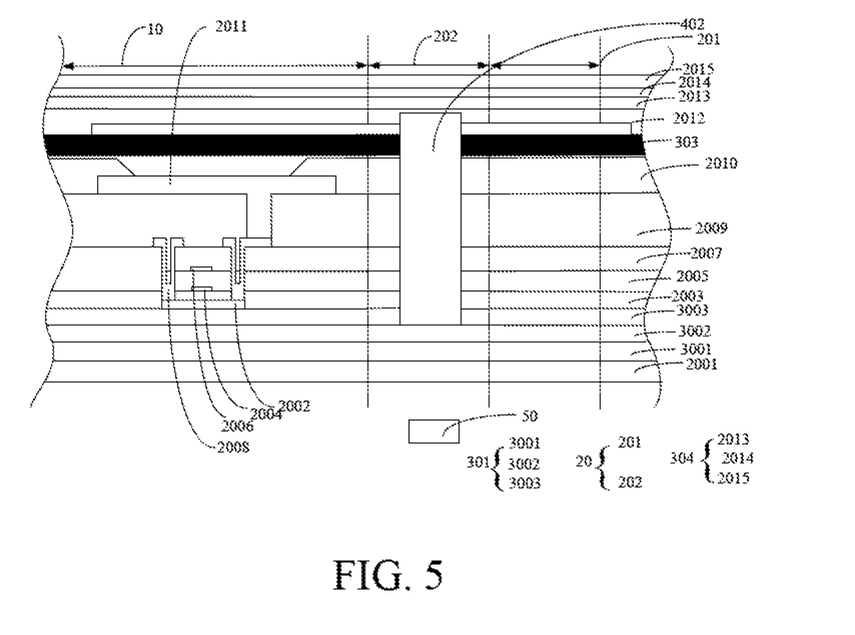
FIG. 5 is a first schematic cross-sectional view of an OLED display device according to an embodiment of the present application.

In one embodiment, as shown in FIG. 5, in the OLED display device, the blocking member 40 is a protrusion structure 402, and a thickness of the protrusion structure 402 is larger than twice of a film thickness of the light-emitting functional layer 303. The light-emitting functional layer 303 located in the non-display area 202 is disconnected by the protrusion structure 402.

In one embodiment, in the OLED display device, a shape of the protrusion structure 402 is a trapezoidal shape.

In an embodiment, in the OLED display device, in the first through hole, two lateral sides of the cross-section of the protrusion structure 402 are both curved.

In one embodiment, in the OLED display device, in the first through hole, a lateral side of a cross-section of the protrusion structure 402 near a side of the display area 10 is a curve, and a lateral side of the cross-section of the protrusion structure 402 near a side of the through hole area 201 is a straight line.

In one embodiment, in the OLED display device, in the first through hole, a lateral side of a cross-section of the protrusion structure 402 near a side of the display area 10 is a straight line, and a lateral side of the cross-section of the protrusion structure 402 near a side of the through hole area 201 is a curve.

In one embodiment, in the OLED display device, the protrusion structure 402 is a hydrophobic material.

In one embodiment, in the OLED display device, the hydrophobic material is Teflon.

In one embodiment, in the OLED display device, the hydrophobic material is the same as material of the moisture barrier layer.

In one embodiment, in the OLED display device, a planar shape of digging holes in the non-display area 202 includes, but is not limited to, a circle, an oval, and a polygon.

In one embodiment, in the OLED display device, at least one blocking member 40 is included.

In one embodiment, in the OLED display device, two blocking members 40 are included, and the blocking members 40 are located in the same digging hole area.

In one embodiment, in the OLED display device, two blocking members 40 are included, and the blocking members 40 are located in different digging hole areas.

In one embodiment, in the OLED display device, a first blocking member 40 is located in the non-display area 202, and a second blocking member 40 is located in the through hole area 201.

In one embodiment, in the OLED display device, the blocking member 40 located in the first through hole does not penetrate through the second flexible organic layer.

Figure 6:
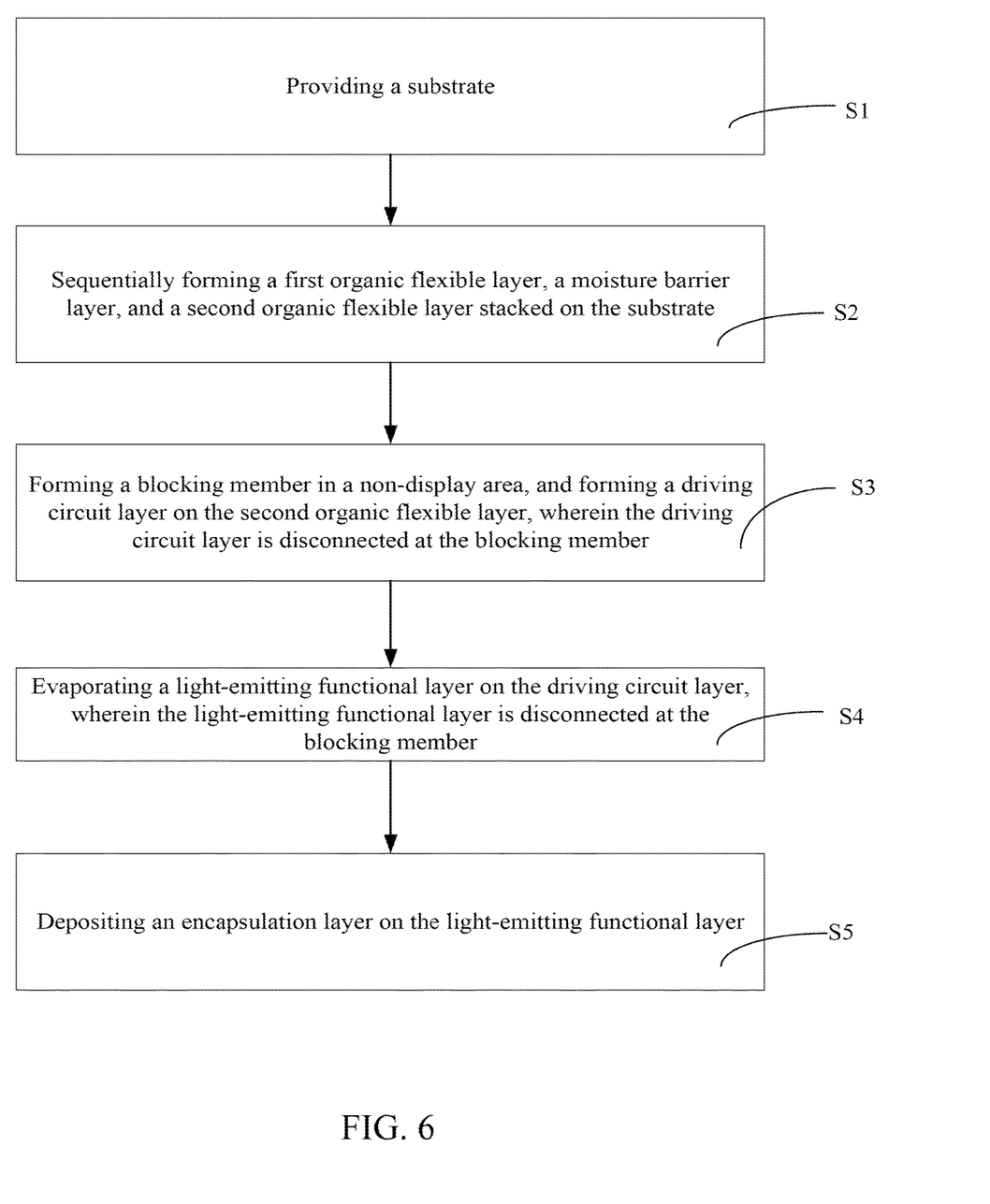
FIG. 6 is a second schematic cross-sectional view of an OLED display device provided by an embodiment of the present application.
Figure 7:
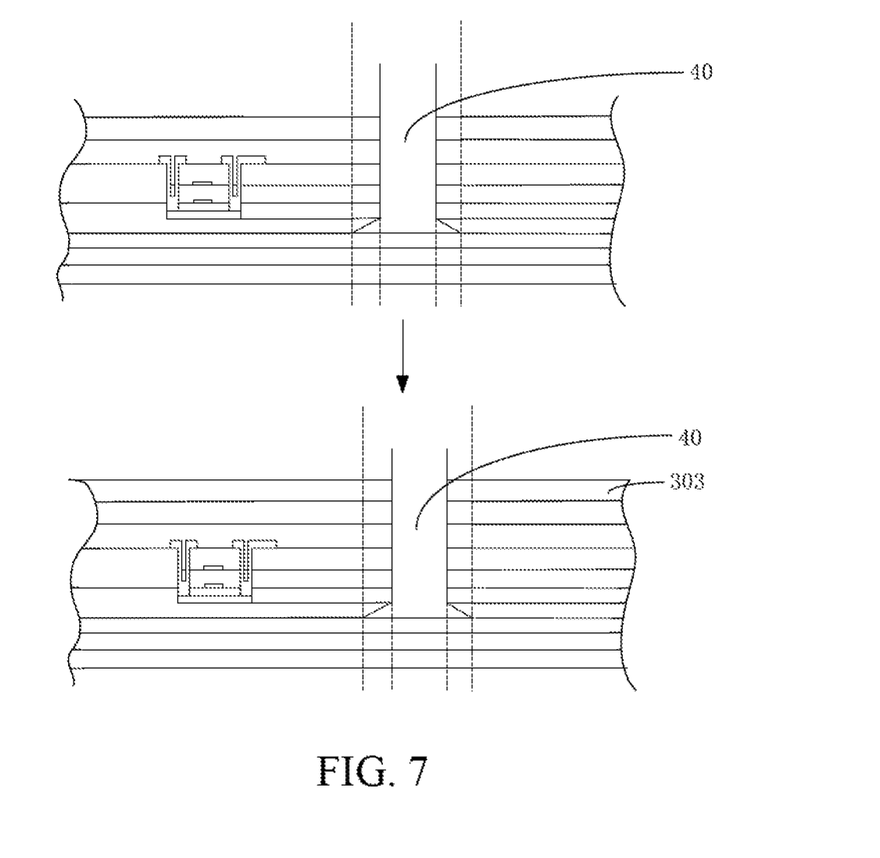
FIG. 7 is a manufacturing schematic view of a manufacturing method of an OLED display panel according to an embodiment of the present application.

As shown in FIG. 6 and FIG. 7, an embodiment of the present application provides a manufacturing method of an organic light-emitting diode (OLED) display panel, includes steps of:

S1; providing a substrate;

S2: sequentially forming a first organic flexible layer, a moisture barrier layer, and a second organic flexible layer stacked on the substrate;

S3: forming a blocking member in a non-display area, and forming a driving circuit layer on the second organic flexible layer, wherein the driving circuit layer is disconnected at the blocking member;

S4: evaporating a light-emitting functional layer on the driving circuit layer, wherein the light-emitting functional layer is disconnected at the blocking member;

S5: depositing an encapsulation layer on the light-emitting functional layer.

In one embodiment, the manufacturing method further includes a step of: forming a blocking wall on a concave hole structure 401 by exposure and etching or shielding by a mask, wherein material of the blocking wall is the same as the blocking member 40.

According to the above embodiments, it can be known that:

The present application provides an OLED display panel, a device, and a manufacturing method thereof. The OLED display panel includes a display area, a through hole area provided corresponding to an electronic component, and a non-display area provided between the display area and the through hole area. The OLED display panel includes a base plate, a driving circuit layer, a light-emitting functional layer, an encapsulation layer, and a blocking member. The flexible substrate includes a first organic flexible layer, a moisture barrier layer, and a second organic flexible layer which are sequentially stacked on the substrate. The blocking member is provided in the non-display area and is located between the second organic flexible layer and the encapsulation layer, and the light-emitting functional layer is disconnected by the blocking member. By providing the blocking member in the non-display area and by disconnecting the light-emitting functional layer through the blocking member, the external moisture cannot enter the display area along the light-emitting functional layer through a side wall of the hole, which relieves the technical problem that the moisture invades the panel along the light-emitting functional layer after the hole is dug in the prior art.

In summary, although the present application has been disclosed above with preferred embodiments, the above preferred embodiments are not intended to limit the scope of the present application. Those skilled in the art can make various modifications and improvements without departing from the spirit and scope of the present application. Therefore, the protection scope of the present application is subject to the scope defined by the claims.

The invention claimed is:

1. An organic light-emitting diode (OLED) display panel, comprising a display area, a through hole area configured to correspond an electronic component, and a non-display area provided between the display area and the through hole area, the OLED display panel comprising:
   a base plate comprises a first flexible layer, a moisture barrier layer and a second flexible layer sequentially stacked;
   a driving circuit layer provided on the second flexible layer;
   a light-emitting functional layer provided on the driving circuit layer;
   an encapsulation layer; and
   a blocking member provided in the non-display area and located between the second flexible layer and the encapsulation layer,
   wherein the light-emitting functional layer is disconnected by the blocking member,
   wherein in the non-display area, the display panel comprises a concave hole structure, and the blocking member provided in the concave hole structure.

2. The OLED display panel according to claim 1, wherein the concave hole structure comprises a first through hole penetrating through the second flexible layer and a second through hole penetrating through the light-emitting functional layer and the driving circuit layer, and the blocking member filled in the first through hole and the second through hole.

3. The OLED display panel according to claim 2, wherein the light-emitting functional layer comprises an organic light-emitting layer, the organic light-emitting layer comprising a first region of the light-emitting functional layer provided on a bottom of the first through hole, a second region of the light-emitting functional layer provided on a side wall of the driving circuit layer and on a side wall of the second through hole located in the second through hole, wherein the blocking member provided on the light-emitting functional layer located in the first through hole.

4. The OLED display panel according to claim 3, wherein a cross-sectional shape of the first through hole is a trapezoidal shape, and a cross-sectional shape of the second through hole is a rectangular shape.

5. The OLED display panel according to claim 1, wherein an included angle formed by the two lateral sides of a cross-section of the first through hole of the concave hole structure and corresponding lateral sides of a cross-section of the second through hole of the concave hole structure is greater than 180 degrees.

6. The OLED display panel according to claim 1, wherein a hydrophobic material is filled in the concave hole structure, and the hydrophobic material is the same as material of the light-emitting functional layer.

7. The OLED display panel according to claim 2, wherein the blocking member is a protrusion structure, and in the non-display area, the light-emitting functional layer is disconnected by the protrusion structure at the first through hole.

8. An organic light-emitting diode (OLED) display device, comprising a display area, a through hole area configured to correspond an electronic component, and a non-display area provided between the display area and the through hole area, the OLED display device comprising:
   a base plate comprises a first flexible layer, a moisture barrier layer and a second flexible layer sequentially stacked;
   a driving circuit layer provided on the second flexible layer;
   a light-emitting functional layer provided on the driving circuit layer;
   an encapsulation layer; and
   a blocking member provided in the non-display area and located between the second flexible layer and the encapsulation layer,
   wherein the light-emitting functional layer is disconnected by the blocking member,
   wherein in the non-display area, the display device comprises a concave hole structure, and the blocking member provided in the concave hole structure.

9. The OLED display device according to claim 8, wherein the concave hole structure comprises a first through hole penetrating through the second flexible layer, a second through hole penetrating through the light-emitting functional layer and the driving circuit layer, and the blocking member filled in the first through hole and the second through hole.

10. The OLED display device according to claim 9, wherein the light-emitting functional layer comprises an organic light-emitting layer, the organic light-emitting layer comprising a first region of the light-emitting functional layer provided on a bottom of the first through hole, a second region of the light-emitting functional layer provided on a side wall of the driving circuit layer and on a side wall of the second through hole located in the second through hole, wherein the blocking member provided on the light-emitting functional layer located in the first through hole.

11. The OLED display device according to claim 10, wherein a cross-sectional shape of the first through hole is a trapezoidal shape, and a cross-sectional shape of the second through hole is a rectangular shape.

12. The OLED display device according to claim 8, wherein an included angle formed by the two lateral sides of a cross-section of the first through hole of the concave hole structure and corresponding lateral sides of a cross-section of the second through hole of the concave hole structure is greater than 180 degrees.

13. The OLED display device according to claim 8, wherein a hydrophobic material is filled in the concave hole structure, and the hydrophobic material is the same as material of the light-emitting functional layer.

14. The OLED display device according to claim 9, wherein the blocking member is a protrusion structure, and in the non-display area, the light-emitting functional layer is disconnected by the protrusion structure at the first through hole.

15. The OLED display device according to claim 14, wherein two lateral sides of a cross-section of the protrusion structure are both curved.

16. The OLED display device according to claim 14, wherein in the first through hole, a lateral side of a cross-section of the protrusion structure near a side of the display area is a curve, and a lateral side of the cross-section of the protrusion structure near a side of the through hole area is a straight line.

17. A manufacturing method of an organic light-emitting diode (OLED) display panel, comprising steps of:

providing a substrate;

sequentially forming a first organic flexible layer, a moisture barrier layer, and a second organic flexible layer stacked on the substrate;

forming a blocking member in a non-display area, and forming a driving circuit layer on the second organic flexible layer, wherein the driving circuit layer is disconnected at the blocking member;

evaporating a light-emitting functional layer on the driving circuit layer, wherein the light-emitting functional layer is disconnected at the blocking member; and depositing an encapsulation layer on the light-emitting functional layer, wherein in the non-display area, a concave hole structure is formed in the display panel, and the blocking member formed in the concave hole structure.

18. The manufacturing method of the OLED display panel according to claim 17, wherein the manufacturing method further comprises a step of: forming a blocking wall on a concave hole structure by means of exposure and etching or shielding by a mask, wherein material of the blocking wall is the same as the blocking member.

* * * * *